(12) United States Patent
Kihlberg

(10) Patent No.: US 9,498,658 B2
(45) Date of Patent: Nov. 22, 2016

(54) RESPIRATOR MASK SPEECH ENHANCEMENT APPARATUS AND METHOD

(71) Applicant: 3M INNOVATIVE PROPERTIES COMPANY, St. Paul, MN (US)

(72) Inventor: Roger Kihlberg, Värnamo (SE)

(73) Assignee: 3M Innovative Properties Company, St. Paul, MN (US)

( * ) Notice: Subject to any disclaimer, the term of this patent is extended or adjusted under 35 U.S.C. 154(b) by 889 days.

(21) Appl. No.: 13/833,131

(22) Filed: Mar. 15, 2013

(65) Prior Publication Data

US 2014/0216448 A1  Aug. 7, 2014

Related U.S. Application Data

(63) Continuation-in-part of application No. 13/757,493, filed on Feb. 1, 2013.

(51) Int. Cl.
*A62B 18/08* (2006.01)
*A62B 18/02* (2006.01)
(Continued)

(52) U.S. Cl.
CPC .............. *A62B 18/08* (2013.01); *A62B 18/02* (2013.01); *H03G 3/32* (2013.01); *H03G 5/00* (2013.01);
(Continued)

(58) Field of Classification Search
CPC ........ A62B 18/02; A62B 18/08; A62B 7/14; A62B 18/00; A62B 18/04; A62B 18/10; A62B 9/04; G10L 21/0364; G10L 25/78; G10L 21/0316; G10L 25/93; G10L 21/0208; G10L 21/02; G10L 11/06; H04B 10/10;
(Continued)

(56) References Cited

U.S. PATENT DOCUMENTS 3,314,424 A   4/1967 Berman
4,352,353 A   10/1982 Bolton
(Continued)

FOREIGN PATENT DOCUMENTS

DE   3013939    10/1981
GB   2 165 721   4/1986
(Continued)

OTHER PUBLICATIONS

International Application PCT/US2014/012188 Search Report dated Nov. 14, 2014.
(Continued)

*Primary Examiner* — Vivian Chin
*Assistant Examiner* — Ubachukwu Odunukwe

(57) ABSTRACT

Speech enhancement apparatus and respirator masks including speech enhancement apparatus, as well as methods of enhancing speech transmission for the wearer of a respirator mask are described herein. In one or more embodiments, the speech enhancement apparatus and methods described herein detect acoustic energy within a first frequency range in the clean air envelope of a respirator mask and deliver compensating acoustic energy outside of the clean air envelope using a speaker. The compensating acoustic energy, in one or more embodiments, exhibits a predetermined attenuated amplitude profile such that the compensating acoustic energy has an amplitude less than 6 dB greater than the acoustic attenuation profile of the mask body over at least 90% of a predetermined attenuated frequency range.

23 Claims, 4 Drawing Sheets

(51) Int. Cl.
*H03G 5/00* (2006.01)
*H03G 3/32* (2006.01)
*H03G 5/02* (2006.01)
*H03G 3/00* (2006.01)
*H04R 29/00* (2006.01)
*H03G 3/20* (2006.01)
*G10L 21/0316* (2013.01)
*G10L 21/0364* (2013.01)
*G10L 25/78* (2013.01)

(52) U.S. Cl.
CPC .......... *H03G 5/025* (2013.01); *G10L 21/0316* (2013.01); *G10L 21/0364* (2013.01); *G10L 25/78* (2013.01); *H03G 3/00* (2013.01); *H03G 3/20* (2013.01); *H04R 29/004* (2013.01)

(58) Field of Classification Search
CPC ........ H04B 1/38; H04B 1/385; H04B 10/00; H04B 15/00; H04R 1/22; H04R 1/44; H04R 1/222; H04R 1/08; H04R 1/083; H04R 1/1083; H04R 1/10; H04R 1/04; H04R 3/02; H04R 3/00; H04R 27/04; H04R 27/00; H04R 5/023; H04R 1/028; H04R 2420/07; H04R 31/00; H04R 19/005; H04R 31/006; H04R 19/00; H04R 19/04; H04R 21/00; H04R 21/02; H04R 9/00; H04R 9/08; H04R 1/025; H04R 11/04; H04R 17/02; H04R 29/004; G08B 23/00; G08B 21/0415; G08B 21/16; A42B 3/30; A42B 3/04; H04W 84/10; G10K 11/1784; G10K 2210/108; G10K 11/1788; H03B 29/00; B64D 10/00; A61M 15/00; A61M 16/06; A61M 16/0683; A61M 16/0633; A61M 16/00; H04M 1/05; H04M 1/04; A61H 23/0236; A61H 2205/08; A61H 23/02; B81B 3/0072; B81B 2201/0264; B81B 2203/0127; G11B 19/00; G01L 13/02; A41D 13/05; H03G 3/20; H03G 3/32; H03G 5/00; H03G 5/025; H03G 3/00
USPC ............ 128/201.19, 205.25; 381/123, 102, 381/71.6, 361, 93, 376, 122, 56, 57, 58, 381/101, 103, 104, 110, 98, 71.2, 71.8; 704/500, 226, 205, 246; 379/430; 455/617, 41; 359/142, 154; 441/124; 60/41; 482/13; 601/43; 340/573.1
See application file for complete search history.

(56) References Cited

U.S. PATENT DOCUMENTS

| | | |
|---|---|---|
| 4,400,591 A | 8/1983 | Jennings |
| 4,508,936 A | 4/1985 | Ingalls |
| 4,718,415 A | 1/1988 | Bolnberger |
| 4,980,926 A | 12/1990 | Noetzel |
| 4,989,596 A | 2/1991 | Macris |
| 5,060,308 A | 10/1991 | Bieback |
| 5,101,816 A | 4/1992 | Wilcox |
| 5,138,666 A * | 8/1992 | Bauer ............ H04R 1/083 128/201.19 |
| 5,224,473 A | 7/1993 | Bloomfield |
| 5,224,474 A * | 7/1993 | Bloomfield ........... A62B 18/08 128/201.19 |
| 5,572,990 A | 11/1996 | Berlin |
| 5,829,429 A | 11/1998 | Hughes |
| 5,860,417 A | 1/1999 | Kettl |
| 5,990,793 A | 11/1999 | Bieback |
| 6,101,256 A | 8/2000 | Steelman |
| 6,121,881 A | 9/2000 | Bieback |
| 6,382,206 B1 * | 5/2002 | Palazzotto ............ A62B 18/08 128/201.19 |
| 6,430,298 B1 | 8/2002 | Kettl |
| 7,139,401 B2 | 11/2006 | Culman |
| 7,394,905 B2 | 7/2008 | Miller |
| 7,493,899 B2 | 2/2009 | Davies |
| 2002/0067663 A1 | 6/2002 | Loeppert |
| 2004/0071299 A1 * | 4/2004 | Yoshino ................ H03G 5/165 381/98 |
| 2005/0008183 A1 | 1/2005 | Skillicorn |
| 2005/0063552 A1 * | 3/2005 | Shuttleworth ........... H03G 3/32 381/57 |
| 2005/0063561 A1 | 3/2005 | Birli |
| 2005/0172959 A1 * | 8/2005 | Williams ............... A62B 18/08 128/201.19 |
| 2007/0019824 A1 | 1/2007 | Osmanovic |
| 2007/0098187 A1 * | 5/2007 | Lee ......... A61B 5/121 381/103 |
| 2007/0136050 A1 * | 6/2007 | Tourwe ................ H03G 5/005 704/205 |
| 2010/0108065 A1 | 5/2010 | Zimmerman |
| 2010/0322442 A1 | 12/2010 | Namm |
| 2011/0093262 A1 | 4/2011 | Wittke |
| 2014/0216447 A1 * | 8/2014 | Kihlberg ............... A62B 18/08 128/201.19 |

FOREIGN PATENT DOCUMENTS

| | | |
|---|---|---|
| KR | 200184416 | 6/2000 |
| KR | 100801140 | 2/2008 |
| KR | 10-0828001 | 5/2008 |
| KR | 20110106729 | 9/2011 |
| KR | 10-1118176 | 3/2012 |
| WO | WO 91/07859 | 5/1991 |
| WO | WO 92/15369 | 9/1992 |
| WO | WO 2008/081226 | 7/2008 |
| WO | WO 2008/095917 | 8/2008 |

OTHER PUBLICATIONS

International Application PCT/US2014/012182 Search Report dated Jul. 22, 2014.

* cited by examiner

RESPIRATOR MASK SPEECH ENHANCEMENT APPARATUS AND METHOD

TECHNICAL FIELD

Speech enhancement apparatus and respirator masks including speech enhancement apparatus, as well as methods of enhancing speech transmission for the wearer of a respirator mask are described herein.

BACKGROUND

Respirator masks are used in a wide variety of environments, such as, e.g., paint booths, grain storage facilities, laboratories with hazardous biological materials, environments containing certain chemical fumes, etc. Respirator masks are typically adapted to receive a variety of filter units and other attachments that are designed specifically for the hazardous environment in which the mask is to be used. As such, the same mask body can be used in a variety of different hazardous environments simply by changing the filter. This ease of changing filters makes the masks very cost effective by permitting the manufacture of a single mask for multiple environments.

Respirator masks define a clean air envelope with the face of the wearer. The clean air envelope includes the clean air source and is bounded by the mask, the mask's seal with the face of the wearer, and the exhalation valve of the mask.

There are two general designs of respirator face masks: the partial facepiece respirator mask and the full facepiece respirator mask. A partial facepiece respirator mask typically encloses the wearer's mouth and nose and forms a seal with the portion of the wearer's face that is contiguous to the nose and mouth. The eyes are left unprotected when using the partial facepiece respirator mask. The full facepiece respirator mask is a much larger unit and encloses the wearer's eyes in addition to the wearer's nose and mouth.

Respirator masks can additionally be distinguished by being either a positive pressure or negative pressure device. A positive pressure device typically includes an external pump or pressurized vessel, with or without a filter, that is the clean air source and that forces air into the mask. A negative pressure respirator mask functions on the negative pressure generated by the wearer inhaling. The inhalation generates a negative pressure inside the clean air envelope and draws air into the respirator mask. Generally, ambient air is drawn through a filter or filters by the negative pressure. The filters clean the air and the air is then drawn into the clean air envelope of the mask for inhalation by the wearer.

Attempts have been made to enhance the intelligibility of speech in connection with respirator masks because the masks cover the wearer's mouth. Passive devices are purely mechanical and active devices involve some form of enhancement by powered amplification. The most common passive communication device is the voice diaphragm. Although voice diaphragms are useful, the level of enhanced intelligibility they provide is limited.

Active speech transmission devices can provide better enhancement of speech, but may be limited by the power required to operate the units. Examples of some active speech amplification units are described in U.S. Pat. Nos. 4,352,353; 4,508,936; 4,989,596; 4,980,926; 5,138,666; 5,224,473; 5,224,474; 6,382,206; etc.

SUMMARY

Speech enhancement apparatus and respirator masks including speech enhancement apparatus, as well as methods of enhancing speech transmission for the wearer of a respirator mask are described herein.

In one or more embodiments, the speech enhancement apparatus and methods described herein detect acoustic energy within a first frequency range in the clean air envelope of a respirator mask and deliver compensating acoustic energy outside of the clean air envelope using a speaker. The compensating acoustic energy, in one or more embodiments, exhibits a predetermined attenuated amplitude profile such that the compensating acoustic energy has an amplitude less than 6 dB greater than the acoustic attenuation profile of the mask body over at least 90% of a predetermined attenuated frequency range. In one or more embodiments, the compensating acoustic energy may be delivered with an attenuated amplitude profile that is uniform or that is non-uniform over the one or more attenuated frequency ranges.

In one or more embodiments, the one or more predetermined attenuated frequency ranges may be selected based on the attenuation characteristics of respirator masks generally or the specific type of respirator mask with which the speech enhancement apparatus is being used. The attenuation characteristics of a respirator mask may be described as the portion or portions of the frequency range of speech that are not passed through the mask or are passed with a reduced amplitude. The speech enhancement apparatus and methods described herein may compensate for the attenuation caused by respirator masks by delivering compensating acoustic energy within the one or more attenuated frequency ranges outside of the clean air envelope. In doing so, the speech enhancement apparatus and methods described herein may increase intelligibility of speech by a person near the wearer of a respirator mask. In one or more embodiments, the compensating acoustic energy may be delivered with an attenuated amplitude profile that is uniform or that is non-uniform over the one or more attenuated frequency ranges.

Because the speech enhancement apparatus and methods described herein deliver acoustic energy over only a portion of the entire speech frequency range and/or with one or more selected attenuated amplitude profiles, the power required to enhance speech using the apparatus and methods described herein may be reduced as compared to, e.g., a system designed to deliver acoustic energy over a broader frequency range, e.g., all of the frequency range as detected in the clean air envelope using the apparatus and methods described herein, or without an attenuated amplitude profile.

In one aspect, one or more embodiments of a respirator mask as described herein may include: a mask body configured to define a clean air envelope between the mask and the mouth and nose of wearer and speech enhancement apparatus. The speech enhancement apparatus comprises a microphone configured for attachment to the mask body, the microphone further configured to detect acoustic energy within the clean air envelope when attached to the mask body; a speaker configured to produce acoustic energy outside of the clean air envelope; and a controller operably connected to the speaker and the microphone.

In one or more embodiments, the controller may be configured to: receive a speech signal from the microphone, wherein the speech signal is indicative of acoustic energy detected by the microphone within a first frequency range; and deliver an output signal to the speaker, wherein the output signal is configured to cause the speaker to emit compensating acoustic energy, wherein the compensating acoustic energy is emitted in one or more predetermined attenuated frequency ranges that cover less than all of the first frequency range, and wherein the compensating acoustic energy comprises a predetermined attenuated amplitude profile over each predetermined attenuated frequency range of the one or more predetermined attenuated frequency ranges.

In one or more embodiments of the respirator masks described herein, the predetermined attenuated amplitude profile is uniform over at least one predetermined attenuated frequency range of the one or more predetermined attenuated frequency ranges.

In one or more embodiments of the respirator masks described herein, the predetermined attenuated amplitude profile is non-uniform over at least one predetermined attenuated frequency range of the one or more predetermined attenuated frequency ranges.

In one or more embodiments of the respirator masks described herein, the speech enhancement apparatus comprises a selector, the selector being operably connected to the controller and configured to select the one or more predetermined attenuated frequency ranges from two or more different predetermined attenuated frequency ranges.

In one or more embodiments of the respirator masks described herein, the speech enhancement apparatus comprises a selector, the selector being operably connected to the controller and configured to select the one or more predetermined attenuated amplitude profile from two or more different predetermined attenuated amplitude profiles.

In one or more embodiments of the respirator masks described herein, the microphone, the speaker and the controller are located in a housing along with a power source that is operably connected to the controller, and wherein the housing is configured for attachment to the mask body. In one or more embodiments, the respirator mask comprises a port, and wherein the housing of the speech enhancement apparatus comprises a fitting configured for selective attachment to the port.

In one or more embodiments of the respirator masks described herein, the microphone is attached to a housing that is configured for attachment to the mask body; and wherein the speaker and the controller are located in an auxiliary housing.

In one or more embodiments of the respirator masks described herein, the one or more predetermined attenuated frequency ranges comprise only one predetermined attenuated frequency range.

In one or more embodiments of the respirator masks described herein, the one or more predetermined attenuated frequency ranges comprise an upper limit of about 10,000 Hz or less.

In one or more embodiments of the respirator masks described herein, the one or more predetermined attenuated frequency ranges comprise a lower limit of about 300 Hz or more.

In another aspect, one or more embodiments of the speech enhancement apparatus configured for attachment to a respirator mask as described herein may include: a microphone configured to detect acoustic energy within a clean air envelope of a respirator mask; a speaker configured to produce acoustic energy outside of the clean air envelope within which the microphone is configured to detect acoustic energy; and a controller operably connected to the microphone and the speaker. In one or more embodiments, the controller may be configured to: receive a speech signal from the microphone, wherein the speech signal is indicative of acoustic energy detected by the microphone within a first frequency range; and deliver an output signal to the speaker, wherein the output signal is configured to cause the speaker to emit compensating acoustic energy, wherein the compensating acoustic energy is emitted in one or more predetermined attenuated frequency ranges that cover less than all of the first frequency range, and wherein the compensating acoustic energy comprises a predetermined attenuated amplitude profile over each predetermined attenuated frequency range of the one or more predetermined attenuated frequency ranges.

In one or more embodiments of the speech enhancement apparatus described herein, the predetermined attenuated amplitude profile is uniform over at least one predetermined attenuated frequency range of the one or more predetermined attenuated frequency ranges.

In one or more embodiments of the speech enhancement apparatus described herein, the predetermined attenuated amplitude profile is non-uniform over at least one predetermined attenuated frequency range of the one or more predetermined attenuated frequency ranges.

In one or more embodiments of the speech enhancement apparatus described herein, the speech enhancement apparatus comprises a selector, the selector being operably connected to the controller and configured to select the one or more predetermined attenuated frequency ranges from two or more different predetermined attenuated frequency ranges.

In one or more embodiments of the speech enhancement apparatus described herein, the speech enhancement apparatus comprises a selector, the selector being operably connected to the controller and configured to select the one or more predetermined attenuated amplitude profiles from two or more different predetermined attenuated amplitude profiles.

In one or more embodiments of the speech enhancement apparatus described herein, the microphone is located in a housing configured for attachment to a port of the respirator mask defining the clean air envelope in which the microphone is configured to detect acoustic energy. In one or more embodiments, the speaker and the controller are located in the housing. In one or more embodiments, the speaker and the controller are located in an auxiliary housing.

In one or more embodiments of the speech enhancement apparatus described herein, the one or more predetermined attenuated frequency ranges comprise only one predetermined attenuated frequency range.

In one or more embodiments of the speech enhancement apparatus described herein, the one or more predetermined attenuated frequency ranges comprise an upper limit of about 10,000 Hz or less.

In one or more embodiments of the speech enhancement apparatus described herein, the one or more predetermined attenuated frequency ranges comprise a lower limit of about 300 Hz or more.

In one or more embodiments of the methods of enhancing speech as described herein, the method may include: detecting acoustic energy in a clean air envelope of a respirator mask using a microphone; delivering a speech signal to a controller from the microphone, wherein the speech signal is indicative of the detected acoustic energy within a first frequency range; and delivering an output signal to a speaker, wherein the output signal causes the speaker to emit compensating acoustic energy outside of the clean air envelope in one or more predetermined attenuated frequency ranges that cover less than all of the first frequency range, and wherein the compensating acoustic energy comprises a predetermined attenuated amplitude profile over each predetermined attenuated frequency range of the one or more predetermined attenuated frequency ranges.

In one or more embodiments of the methods described herein, the predetermined attenuated amplitude profile is uniform over at least one predetermined attenuated frequency range of the one or more predetermined attenuated frequency ranges.

In one or more embodiments of the methods described herein, the predetermined attenuated amplitude profile is non-uniform over at least one predetermined attenuated frequency range of the one or more predetermined attenuated frequency ranges.

In one or more embodiments of the methods described herein, the method comprises selecting the one or more predetermined attenuated frequency ranges from two or more different predetermined attenuated frequency ranges.

In one or more embodiments of the methods described herein, the method comprises selecting the one or more predetermined attenuated amplitude profiles from two or more different predetermined attenuated amplitude profiles.

In one or more embodiments of the methods described herein, the microphone is attached to a housing, and the method comprises attaching the housing to a port on the respirator mask.

In one or more embodiments of the methods described herein, the one or more predetermined attenuated frequency ranges comprise only one predetermined attenuated frequency range.

In one or more embodiments of the methods described herein, the one or more predetermined attenuated frequency ranges comprise an upper limit of about 10,000 Hz or less.

In one or more embodiments of the methods described herein, the one or more predetermined attenuated frequency ranges comprise a lower limit of about 300 Hz or more.

The words "preferred" and "preferably" refer to embodiments described herein that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the invention.

As used herein and in the appended claims, the singular forms "a," "an," and "the" include plural referents unless the context clearly dictates otherwise. Thus, for example, reference to "a" or "the" component may include one or more of the components and equivalents thereof known to those skilled in the art. Further, the term "and/or" means one or all of the listed elements or a combination of any two or more of the listed elements.

It is noted that the terms "comprises" and variations thereof do not have a limiting meaning where these terms appear in the accompanying description. Moreover, "a," "an," "the," "at least one," and "one or more" are used interchangeably herein.

Relative terms such as left, right, forward, rearward, top, bottom, side, upper, lower, horizontal, vertical, and the like may be used herein and, if so, are from the perspective observed in the particular figure. These terms are used only to simplify the description, however, and not to limit the scope of the invention in any way.

The above summary is not intended to describe each embodiment or every implementation of the speech enhancement apparatus, respirator masks including speech enhancement apparatus, and methods of enhancing speech transmission as described herein. Rather, a more complete understanding of the invention will become apparent and appreciated by reference to the following Description of Illustrative Embodiments and claims in view of the accompanying figures of the drawing.

DETAILED DESCRIPTION

Figure 1:
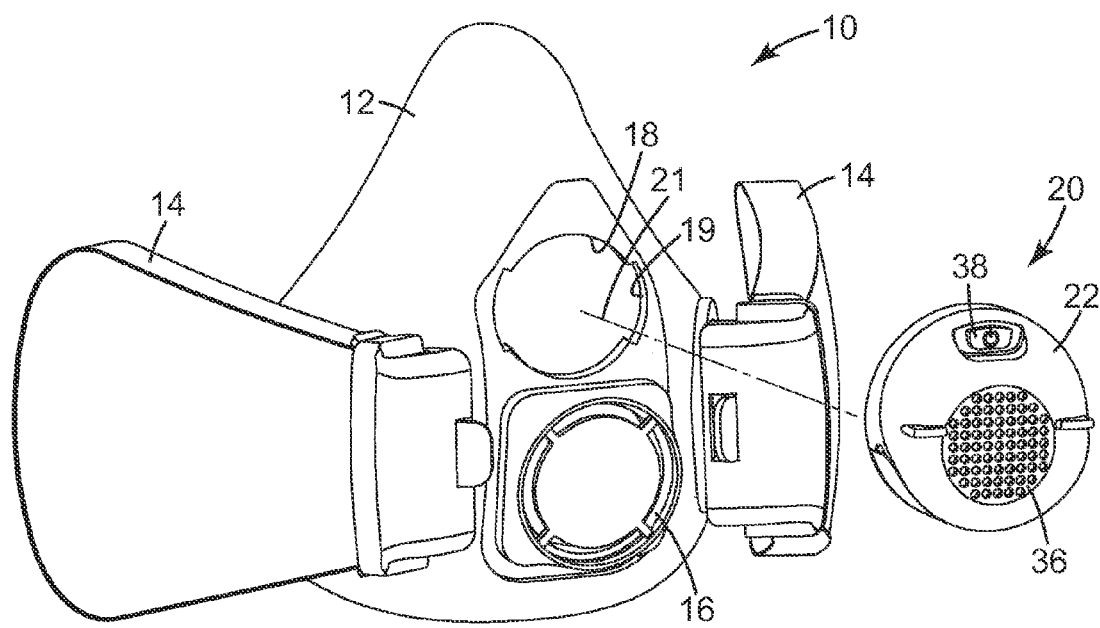
FIG. 1 is a perspective view of one illustrative embodiment of a partial facepiece respirator mask and a speech enhancement apparatus configured for use with the respirator mask.

In the following description of illustrative embodiments, reference is made to the accompanying figures of the drawing which form a part hereof, and in which are shown, by way of illustration, specific embodiments. It is to be understood that other embodiments may be utilized and structural changes may be made without departing from the scope of the present invention.

One illustrative embodiment of a partial facepiece respirator mask 10 is depicted in FIG. 1. The mask 10 may have, in one or more embodiments, a rubberized body 12 that is adapted to enclose the wearer's nose and mouth. Body 12 is designed to form a seal at its periphery with the face of the wearer. Sealing material may be attached proximate the periphery of body 12 to contact the skin of the wearer to form a better seal therewith. Body 12 is formed of a material that is selected to be substantially impermeable to the types of airborne environmental hazards to which the mask 10 is designed to offer a barrier. The mask 10 includes filters 14 used to filter air entering the mask 10 as the wearer inhales. The filters 14 depicted in connection with mask 10 are only one embodiment of many different filters that could be used with the respirator masks as described herein. Respirator masks incorporating the speech enhancement apparatus and deploying the methods as described herein will typically include straps or other attachment structures to retain the respirator mask 10 in position on the wearer's face. No straps or other attachment structures are, however, depicted in connection with respirator mask 10.

The illustrative embodiment of respirator mask 10 depicted in FIG. 1 also includes an exhalation port 16. A flexible diaphragm (not shown) may, in one or more embodiments, be located in the exhalation port 16 and opens responsive to an increase in pressure in the clean air envelop of the mask. Many different embodiments of exhalation ports and diaphragms located therein may be used in connection with the respirator masks as described herein. The wide variety of exhalation ports and associated diaphragms will not, however, be further described herein.

Although the speech enhancement apparatus and methods may, as described herein, be used with a negative pressure respirator mask (one illustrative embodiment of which is mask 10 depicted in FIG. 1), the speech enhancement apparatus and methods described herein may also be used in connection with positive pressure respirator masks. Also, although the mask 10 is a partial facepiece respirator mask, the speech enhancement apparatus described herein may be used with a full facepiece respirator mask in one or more alternative embodiments.

Respirator masks define a clean air envelope around at least the wearer's nose and mouth within the body 12 of the illustrative respirator mask 10 depicted in FIG. 1. The clean air envelope is defined, in large part, by the body 12 of respirator mask 10 and any seal extending around the edges of the respirator mask 10. In respirator masks such as mask 10 as depicted in FIG. 1, the inhalation ports to which filters 14 are attached, along with exhalation port 16 may also, in one or more embodiments, define the clean air envelope.

The illustrative embodiment of respirator mask 10 also includes a speech enhancement apparatus port 18 to which speech enhancement apparatus 20 may be attached. The speech enhancement apparatus 20 is depicted as being selectively attached to the speech enhancement apparatus port 18. In one or more alternative embodiments, the speech enhancement apparatus described herein may be fixedly attached to the respirator mask. As used herein, "fixedly attached" (and variations thereof) means that separation of the speech enhancement apparatus from the respirator mask would require destruction or deformation of a portion of the mask and/or the speech enhancement apparatus.

Figure 2:
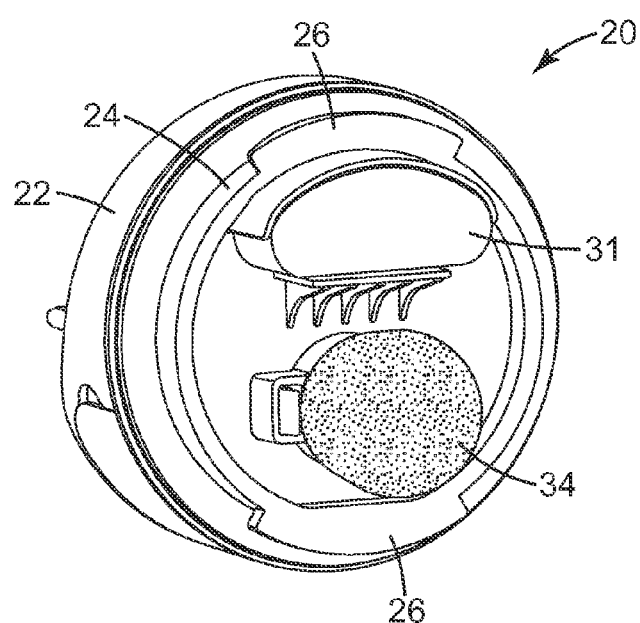
FIG. 2 is a perspective view of the back side of the speech enhancement apparatus depicted in FIG. 1 depicting the structure used to connect the speech enhancement apparatus to the respirator mask and other components of the speech enhancement apparatus.

In one or more embodiments, the speech enhancement apparatus port 18 opens directly into the clean air envelope defined within the respirator mask 10 so that any speech energy emitted within the clean air envelope can reach the speech enhancement apparatus directly. Referring to FIG. 2, the back side of speech enhancement apparatus 20 is depicted. The components on the back side of the speech enhancement apparatus 20 will, in one or more embodiments, typically be located within the clean air envelope defined by the respirator mask 10.

With reference to both FIGS. 1 and 2, the speech enhancement apparatus 20 includes a housing 22 and, in the depicted embodiment, a flange 24 configured for insertion into the speech enhancement apparatus port 18. The flange 24 includes ears 26 that may, in one or more embodiments, be configured to fit within slots 19 in the speech enhancement apparatus port 18 so that rotation of the housing 22 of the speech enhancement apparatus 20 about axis 21 locks the speech enhancement apparatus 20 in place within speech enhancement apparatus port 18. The construction of flange 24, ears 26 and port 18 (along with slots 19) provide a bayonet type fitting for attachment of the speech enhancement apparatus 22 the mask 10. Many other bayonet type fitting structures may be used in place of those depicted in the illustrative embodiment of FIGS. 1 and 2. Further, many other attachment structures may be used to selectively attach the speech enhancement apparatus 20 described herein to a respirator mask 10. Examples of some potentially suitable alternative attachment structures configured for selective attachment may include, but are not limited to: threaded structures, detent mechanisms, straps, etc.

The illustrative embodiment of speech enhancement apparatus 20 includes a controller 30, power supply 32, microphone 34, speaker 36, and selector switch 38. The controllers 30 used in the speech enhancement apparatus described herein may be provided in any suitable form and may, for example, include memory and a controller. The controller may, for example, be in the form of one or more microprocessors, Field-Programmable Gate Arrays (FPGA), Digital Signal Processors (DSP), microcontrollers, Application Specific Integrated Circuit (ASIC) state machines, etc.

In the illustrative embodiment described herein, the controller 30 and power supply 32 of the speech enhancement apparatus 20 may be provided in a control module 31 (see, e.g., FIG. 2), although in one or more alternative embodiments, the controller 30 and power supply 32 may be provided separately. The power supply 32 may be provided in any number of a variety of different forms, including for example, batteries, capacitors, etc.

Because the microphone 34 provided in the speech enhancement apparatus 20 is located on the back side of the housing 22 of the speech enhancement apparatus 20 that includes the flange 24, the microphone 34 will be located within the clean air envelope formed by the respirator mask 10 when the speech enhancement apparatus 20 is attached to the port 18 on the respirator mask 10. As a result, the microphone 34 is positioned to detect acoustic energy within the clean air envelope of the respirator mask 10. Detection of acoustic energy within the clean air envelope allows the microphone 34 to detect speech of the wearer of the respirator mask 10.

As seen in FIG. 1, the speech enhancement apparatus 20 also includes a speaker 36 attached to the housing 22 that, in one or more embodiments, is configured so that acoustic energy produced by the speaker 36 is directed away from the clean air envelope defined within the respirator mask 10. Although the illustrative embodiment of speech enhancement apparatus 20 includes only one speaker 36, in one or more alternative embodiments the speech enhancement apparatus described herein may include more than one speaker.

The illustrative embodiment of speech enhancement apparatus 20 also includes a switch 38 that may be used to turn the speech enhancement apparatus 20 on and off. In one or more alternative embodiments, the selector switch 38 may provide other functions such as, for example, selecting frequency ranges and/or amplitude profiles for the compensating acoustic energy as described below in more detail.

Figure 3:
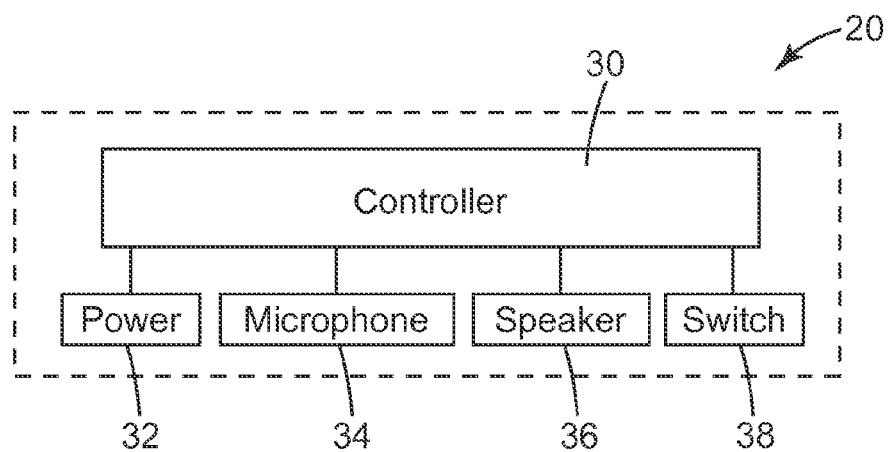
FIG. 3 is a schematic diagram of components in one illustrative embodiment of a speech enhancement apparatus as described herein.

Referring to FIG. 3, in one or more embodiments the controller 30 is operably connected to each of the power supply 32, microphone 34, speaker 36, and selector switch 38. In one or more embodiments, all of the components required to enhance speech using the speech enhancement apparatus as described herein may be located within a housing that is configured to be attached to a respirator mask. Providing all of the components required to enhance speech in the same housing may provide a user with the opportunity to replace a defective speech enhancement apparatus, substitute different speech enhancement apparatus providing different features for use with the same respirator mask, and/or provide speech enhancement apparatus on any respirator mask having an available port that is capable of receiving a speech enhancement apparatus as described herein.

In still other embodiments, the microphone of a speech enhancement apparatus as described herein may be selectively or fixedly attached to a respirator mask in a manner that positions the microphone to detect acoustic energy in the clean air envelope defined by the respirator mask when it is worn by a person whether or not the microphone is located in or attached to a housing that is selectively or fixedly attached to the respirator mask. In such an embodiment, one or both of the controller and speaker may be located in a housing that, itself, may or may not be selectively or fixedly attached to the respirator mask (further, the housing may also contain a power source for the speech enhancement apparatus).

As discussed above in connection with the embodiment depicted in FIGS. 1-3, components of speech enhancement apparatus 20 may all be located within a single housing 22. Alternatively, however, one or more embodiments of the speech enhancement apparatus described herein may be contained in two or more separate housings that may be connected to provide the functionality of the speech enhancement apparatus as described herein. One alternative illustrative embodiment of a speech enhancement apparatus 120 is depicted schematically in FIG. 4. The speech enhancement apparatus 120 depicted in FIG. 4 includes two separate housings 122 and 123. In the depicted embodiment, a microphone 134 is located in housing 122. Because the microphones used in connection with the speech enhancement apparatus described herein are located within the clean air envelope defined by a respirator mask, the housing 122 may, in one or more embodiments, the configured for attachment (selectively or fixedly) to a respirator mask as described herein. As discussed herein, in one or more embodiments, housing 122 may be optional, i.e., the microphone 134 may be selectively or fixedly attached to a respirator mask in the absence of the housing 122 so long as it is configured to detect acoustic energy within the clean air envelope defined by the mask.

Figure 4:
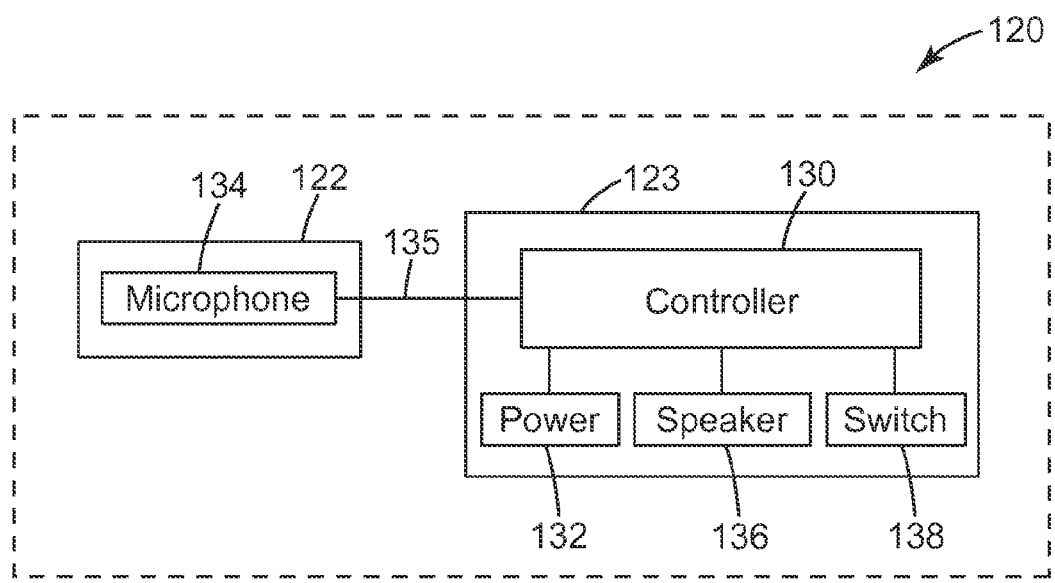
FIG. 4 is a schematic diagram of components in one alternative illustrative embodiment of a speech enhancement apparatus as described herein.

In the depicted embodiment, the remainder of the components of the speech enhancement apparatus 120 as depicted in FIG. 4 are located in an auxiliary housing 123 that is, in one or more embodiments, separate and distinct from the housing 122 such that the housing 122 can be provided in one location (e.g., attached to a respirator mask body) and the auxiliary housing can be provided at a different location. The auxiliary housing 123 may, in one or more embodiments, be configured for attachment to (or incorporation in) the clothing, belts, helmets, backpacks, etc. of a person wearing a respirator mask to which the housing 122 with microphone 134 is attached.

Auxiliary housing 123 includes, in the depicted embodiment, the controller 130 a power supply 132 a speaker 136 and a selector switch 138. A connection 135 is provided in the speech enhancement apparatus 120 to connect the microphone 134 in first housing 122 to the controller 130 in a second housing 123. The connection 135 may, in one or more embodiments, be a wired connection. In one more alternative embodiments, the connection 135 may be in the form of a wireless connection (e.g., Bluetooth, Wi-Fi, RF, optical, etc.)

Some variation in the distribution of the various components of the speech enhancement apparatus 120 may also be possible in alternative embodiments. For example, in one or more embodiments, the speaker 136 may be located within housing 122 along with microphone 134. In another example, selector switch 138 may be located within the housing 122. In still another embodiment, the controller 130 may be located within the housing 122. In one or more embodiments, the only component located within the auxiliary housing 123 may be, for example, the power supply 132. Although the speech enhancement apparatus depicted in FIGS. 3 and 4 include components contained in a single housing or in two housings, in other alternative embodiments the components of the speech enhancement apparatus described herein may be distributed over three or more different housings.

The controllers of the speech enhancement apparatus described herein may, in one or more embodiments, be configured to receive a speech signal from a microphone as described herein. The speech signal received from the microphone is indicative of acoustic energy detected by the microphone. That acoustic energy will, in the embodiments described herein, typically be dominated by the acoustic energy generated by a wearer of the respirator mask when they are speaking. In one or more embodiments, the speech signal may be indicative of acoustic energy detected by the microphone within a first frequency range.

The controller is also operably connected to the speaker so that the controller may be configured to deliver an output signal to the speaker. The output signal delivered to the speaker by the controller may, in one or more embodiments, be configured to cause the speaker to emit compensating acoustic energy as described herein. In one or more embodiments, the compensating acoustic energy is based on the speech signal provided by the microphone and may be emitted in one or more predetermined attenuated frequency ranges over which a respirator mask may attenuate the acoustic energy of speech. In some embodiments, the one or more ranges may cover less than all of the first frequency range detected within the clean air envelope of the respirator mask. In one or more embodiments, the compensating acoustic energy may be emitted in only one predetermined attenuated frequency range that covers less than all of the first frequency range detected within the clean air envelope of the respirator mask. In other exemplary embodiments, the compensating acoustic energy may be emitted in one or more predetermined attenuated frequency ranges that cover all or a portion of the first frequency range detected within the clean air envelope of the respirator mask.

Further, in one or more embodiments, the compensating acoustic energy may have one or more predetermined attenuated amplitude profiles over each of the one or more predetermined attenuated frequency ranges. In other words, one or more embodiments may involve delivery of compensating acoustic energy in a first frequency range with a first attenuated amplitude profile and in a second (different) frequency range with a second attenuated amplitude profile that is the same or different than the first attenuated amplitude profile.

Operation of the speech enhancement apparatus described herein to detect acoustic energy within the clean air envelope and deliver compensating acoustic energy outside of the clean air envelope to compensate for the attenuation of speech caused by a respirator mask as described herein can be described in connection with FIGS. 5 and 6.

Figure 5:
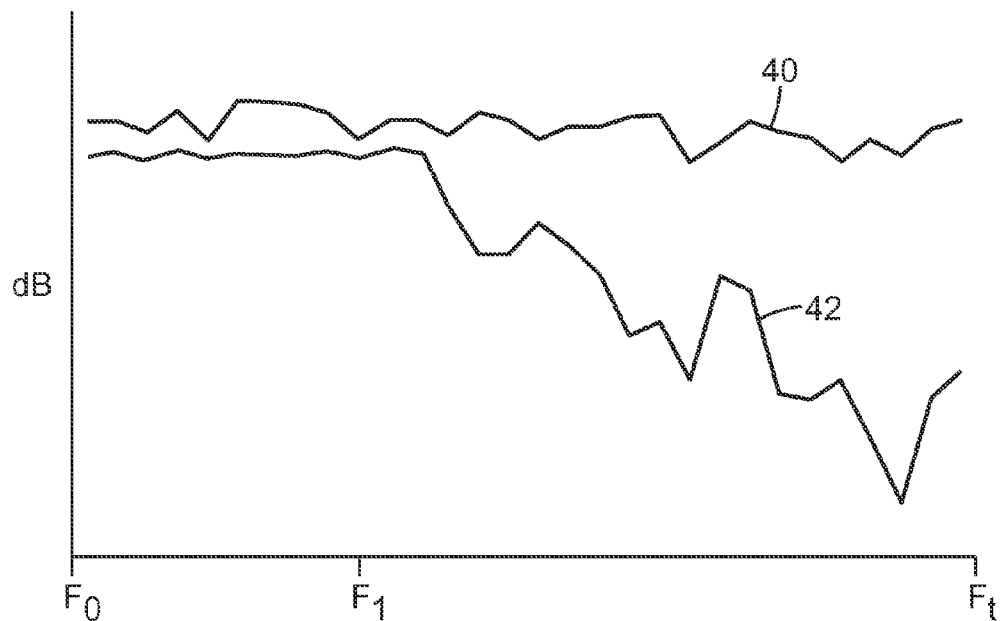
FIG. 5 depicts one illustrative plot of acoustic energy detected within the clean air envelope of a respirator mask and one illustrative plot of that acoustic energy as attenuated by a mask.
Figure 6:
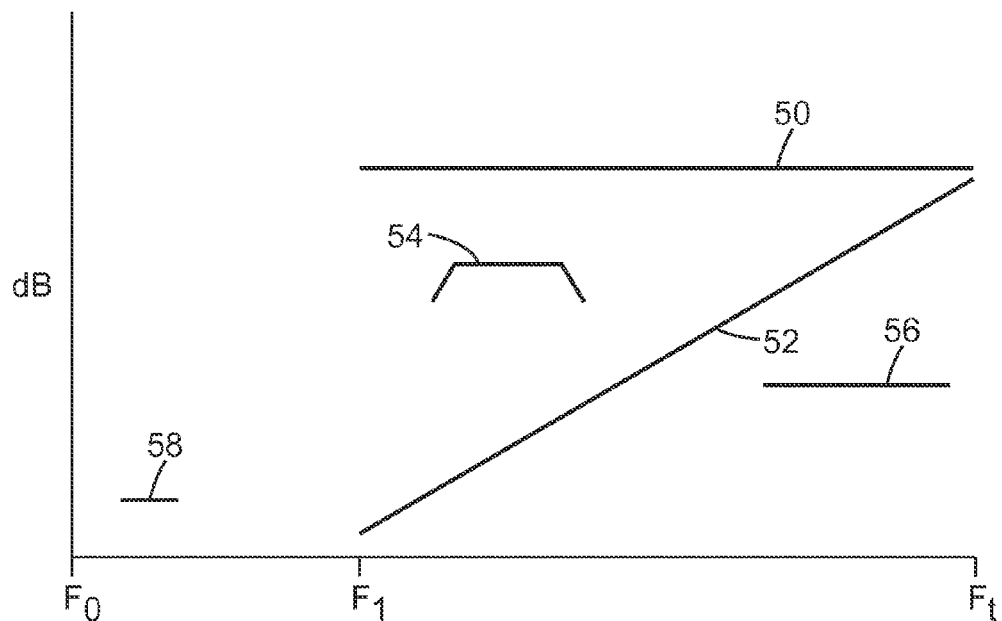
FIG. 6 depicts various illustrative embodiments of compensating acoustic energy that may be provided using the speech enhancement apparatus and methods described herein.

Illustrative examples of acoustic energy detected within the clean air envelope and outside the clean air envelope of a respirator mask are depicted in FIG. 5. Plot 40 is one illustrative example of acoustic energy detected within a clean air envelope of a respirator mask. The acoustic energy represented by plot 40 is one example of the amplitude and frequency range of the acoustic energy generated when the wearer of a respirator mask speaks while wearing the mask. That acoustic energy is, in the depicted embodiment, generated over a first frequency range that extends from $F_0$ to $F_r$.

As described herein, the speech enhancement apparatus includes a microphone located within the clean air envelope of the respirator mask to detect such acoustic energy over a first frequency range. The first frequency range over which acoustic energy is detected may, in one or more embodiments, encompass the entire expected frequency range for the acoustic energy of speech, as well as the amplitude of that acoustic energy over that frequency range. However, in one or more alternative embodiments, the first frequency range over which acoustic energy is detected as described herein may not include all of the frequency range and/or amplitude of acoustic energy generated within a mask by a wearer of the mask.

Plot 42 as seen in FIG. 5 is one illustrative example of the acoustic energy detected outside of a clean air envelope of a respirator mask after attenuation of the acoustic energy represented by plot 40 within the clean air envelope. The plot 42 illustrates that the amplitude of acoustic energy over at least a portion of the first frequency range of plot 42 is significantly decreased as compared to the amplitude of the acoustic energy detected within the clean air envelope. Accordingly, the respirator mask exhibits an acoustic attenuation profile characterized by the difference between the amplitude of acoustic energy inside and outside of the clean air envelope of the mask at a particular frequency or over a particular frequency range. In the illustrative examples depicted in FIG. 5, that attenuation is more pronounced at the higher frequencies within the frequency range $F_1$ to $F_t$, although some attenuation is also present in the lower end of the frequency range from $F_0$ to $F_1$.

To compensate for the attenuation of acoustic energy by a respirator mask, the speech enhancement apparatus and methods described herein provide compensating acoustic energy outside of the clean air envelope based on the acoustic energy detected within the clean air envelope and/or the acoustic attenuation profile of the respirator mask. Referring to FIG. 6, various illustrative examples of the compensating acoustic energy that may be delivered outside of the clean air envelope using the speech enhancement apparatus described herein are depicted as plots 50, 52, 54, 56, and 58.

In one or more embodiments, the speech enhancement apparatus and methods described herein may deliver compensating acoustic energy over one or more predetermined attenuated frequency ranges that may be selected based on the frequency range over which a respirator mask attenuates the acoustic energy of speech to a degree that can adversely affect its intelligibility by persons located near the wearer of the respirator mask. The one or more predetermined attenuated frequency ranges may, as depicted in FIG. 6, be provided within the selected frequency range from $F_1$ to $F_t$ (see, e.g., plots 50, 52, 54, and 56 in FIG. 6). In one or more alternative embodiments, however, the one or more predetermined attenuated frequency ranges may lie outside of the selected frequency range $F_1$ to $F_t$ over which a respirator mask significantly attenuates the acoustic energy of speech (see, e.g., plot 58 in FIG. 6). In one or more alternative embodiments, at least one of the one or more predetermined attenuated frequency ranges may span the entire selected frequency range $F_1$ to $F_t$ (see, e.g., plots 50 and 52 in FIG. 6), or the entire frequency range that the microphone operates in, e.g. $F_0$ to $F_t$.

In one or more embodiments, the one or more predetermined attenuated frequency ranges may, for example, have a lower limit of 300 Hz or more, possibly 500 Hz or more, or even 1000 Hz or more. In other words, the compensating acoustic energy may be delivered over one or more frequency ranges starting at or above one of these selected lower limits. In one or more embodiments, the one or more predetermined attenuated frequency ranges may, for example, have no set upper or lower limits (i.e., the upper or lower limits may simply be the upper or lower limits at which the speaker and/or circuitry within the controller are capable of delivering acoustic energy). In one or more alternative embodiments, however, the one or more predetermined attenuated frequency ranges may have an upper limit of, e.g., 10,000 Hz or less, possibly 9000 Hz or less, or even 8000 Hz or less. The compensating acoustic energy may be delivered over a frequency range that extends, at most, up to one of these upper limits in one or more embodiments of the speech enhancement apparatus and methods described herein.

In one or more embodiments, the speech enhancement apparatus and methods described herein may deliver the compensating acoustic energy based on the acoustic energy detected by a microphone within the clean air envelope with a flat frequency response. Plot 50 as seen in FIG. 6 is one illustrative example of compensating acoustic energy delivered within the predetermined attenuated frequency range with a flat frequency response such that the attenuated amplitude profile of the compensating acoustic energy is uniform over the attenuated frequency range, e.g., from $F_1$ to $F_t$.

In one or more alternative embodiments, the speech enhancement apparatus and methods described herein may deliver compensating acoustic energy based on the acoustic energy detected by a microphone within the clean air envelope that has a non-uniform attenuated amplitude profile. Plot 52 as seen in FIG. 6 is one illustrative example of compensating acoustic energy delivered with a non-uniform attenuated amplitude profile over a predetermined attenuated frequency range, e.g., from $F_1$ to $F_t$.

The attenuated amplitude profile represented by plot 52 is only one example of an infinite number of potential non-uniform attenuated amplitude profiles that could be used in connection with the speech enhancement apparatus and methods described herein. For example, in one or more embodiments, the compensating acoustic energy may be delivered with an amplitude profile that is not linear, e.g., that highlights or particularly enhances one or more selected frequencies or frequency ranges within the attenuated frequency range that may be determined to particularly enhance the intelligibility of speech by persons located near the wearer of a respirator mask using the speech enhancement apparatus described herein. Plot 54 as seen in FIG. 6 is one illustrative example of compensating acoustic energy delivered with a non-uniform attenuated amplitude profile over a predetermined attenuated frequency range that highlights or enhances one frequency range within an attenuated frequency range.

As one example, it may be useful to accentuate higher frequencies such as, e.g., the frequencies within a range from 3000 kHz to 4000 kHz (with, e.g., a peak around 3700 kHz) to improve the intelligibility of speech. Although the compensating acoustic energy may be delivered over a wider frequency range (e.g., from 300 Hz up to, e.g., 10,000 Hz), the compensating acoustic energy delivered within a smaller frequency range and/or at selected frequencies within that wider frequency range may be used to possibly further enhance intelligibility of speech as described herein.

In an exemplary embodiment, the speech enhancement apparatus and methods described herein deliver compensating acoustic energy over one or more predetermined attenuated frequency ranges and exhibit an amplitude related to the acoustic attenuation profile of the respirator mask. Compensating acoustic energy having a minimal amplitude may be provided at frequencies or frequency ranges at which the respirator mask causes little or no attenuation, and with a greater amplitude at frequencies or frequency ranges at which the respirator mask causes greater attenuation. For example, compensating acoustic energy may be provided having an amplitude that is within 12 dB, or within 6 dB, or within 3 dB or less of the amplitude value of the acoustic attenuation profile (i.e. the acoustic energy attenuated by a mask at any specified frequency or range of frequencies).

The attenuation caused by a respiratory mask, and thus the acoustic attenuation profile of the mask, depends primarily on the materials, construction, and configuration of the mask. Accordingly, various masks of a particular model or type may exhibit a similar or identical acoustic attenuation profile at a particular frequency or over a particular frequency range. The amplitude profile of compensating acoustic energy over a desired frequency range may thus be selected for a particular mask model or type based on the acoustic attenuation profile of that particular mask model or type.

The acoustic attenuation profile of a mask may be measured according to any suitable technique as known in the art. For example, the acoustic attenuation profile may be determined by measuring acoustic energy delivered from a user both while not wearing the mask and while wearing the mask over the nose and mouth. In an exemplary procedure, predetermined words are spoken by a user not wearing a mask while in an anechoic chamber such that acoustic energy is generated by the user over a range of frequencies. The acoustic energy is measured by a microphone, such as a type 2669 measurement microphone available from Bruel & Kjaer of Nærum Denmark, for example, positioned at a distance one meter in front of a user's mouth. The user then speaks the same predetermined words while wearing the mask over the nose and mouth, and the microphone measures the acoustic energy generated by the user. The difference between the acoustic energy detected when the user was not wearing the mask from the acoustic energy detected when the user was wearing the mask represents the acoustic attenuation profile of the mask. The difference between sound detected when the user was wearing the mask and the user was not wearing the mask is due to acoustic attenuation caused by the mask, and the acoustic attenuation may be determined at any given frequency or range of frequencies. The procedure may be repeated with several users, such as 5 users for example, to ensure an accurate attenuation profile of the mask.

Figure 7:
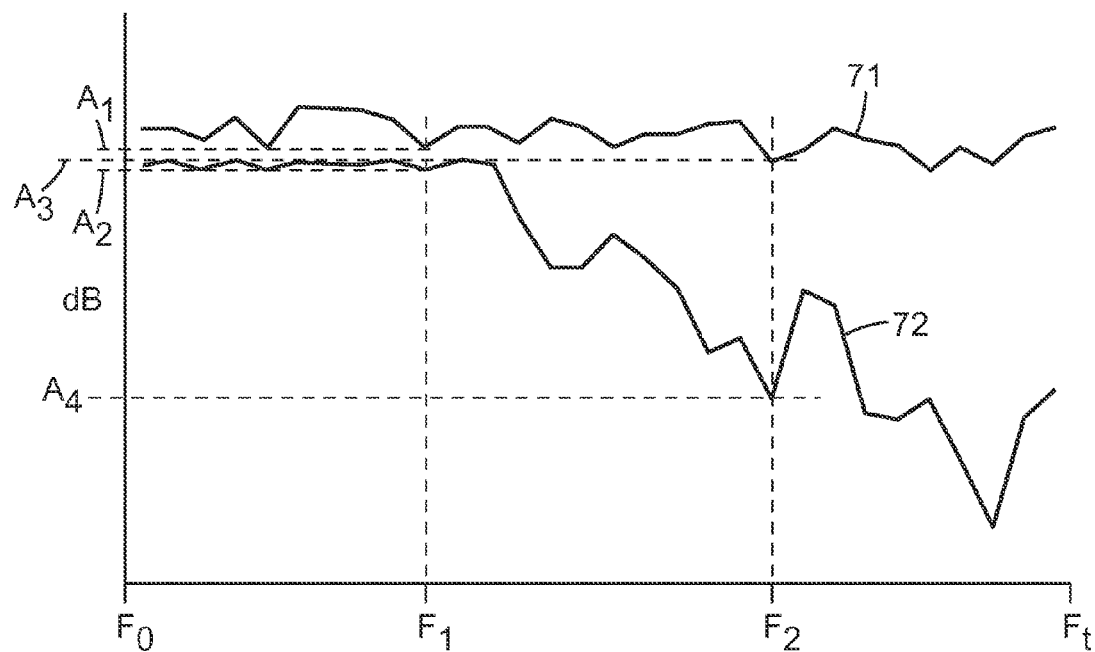
FIG. 7 depicts an illustrative embodiment of acoustic energy from a user measured while not wearing a mask and acoustic energy from a user measured while wearing a mask.

FIG. 7 shows exemplary plots 71 and 72 representing measured acoustic energy while a user is wearing a mask and while a user is not wearing a mask, respectively. At a relatively lower frequency $F_1$, for example, the amplitude $A_1$ of acoustic energy measured without a mask and the amplitude $A_2$ of acoustic energy measure with the mask is similar indicating that the acoustic attenuation caused by the mask at $F_1$ is relatively small. At a relatively higher frequency $F_2$, for example, the amplitude $A_3$ of acoustic energy measured without a mask and the amplitude $A_4$ of acoustic energy measure with the mask is very different indicating that the acoustic attenuation caused by the mask at $F_2$ is relatively large.

Figure 8:
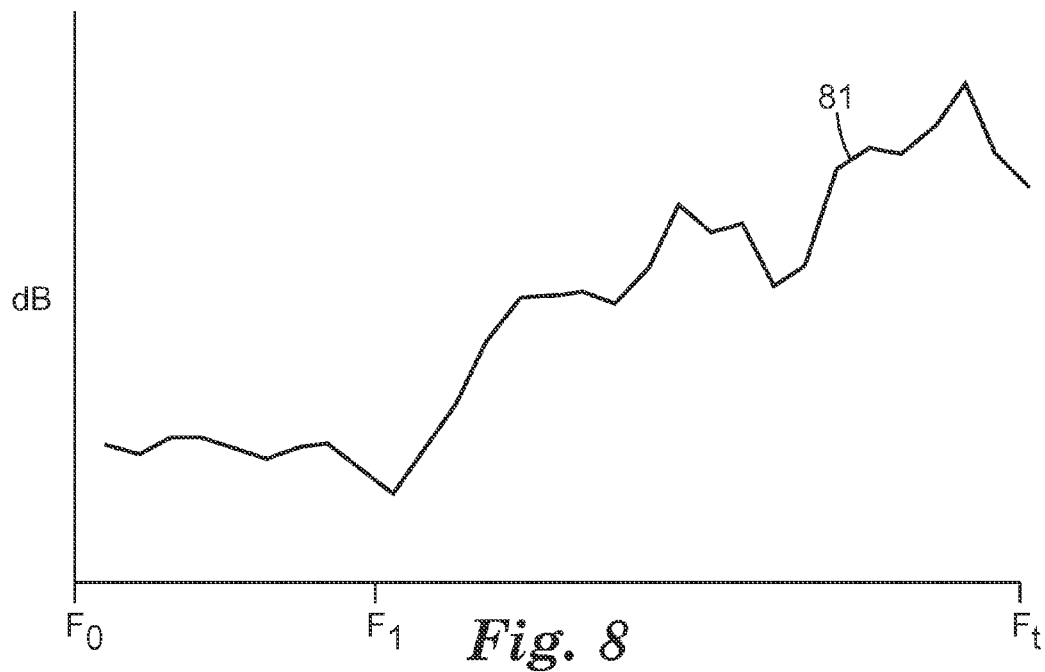
FIG. 8 depicts an illustrative embodiment of an acoustic attenuation profile of an exemplary respirator mask.

An exemplary attenuation profile determined from the difference in acoustic energy measured with and without a mask may be provided over an entire frequency range $F_0$ to $F_t$ and is represented by plot 81 in FIG. 8. In an exemplary embodiment, compensating acoustic energy having an amplitude of less than 12 dB, or less than 6 dB, or less than 3 dB, greater than the acoustic attenuation profile of a mask is provided over at least 90%, or at least 95%, or approximately 100% of the one or more predetermined attenuated frequency ranges. That is, compensating acoustic energy is provided that approximately corresponds to or is less than the acoustic attenuation profile of a mask. Compensating acoustic energy having such an amplitude profile provides a desired balance of limited power consumption and high fidelity and provides an effective communication device that may be used for an extended period of time with a single battery charge, for example. Compensating acoustic energy may thus be provided to best reproduce the speech of a user while reducing power consumption that may be associated with reproducing all acoustic energy generated within the clean air envelope.

In one or more embodiments, the speech enhancement apparatus and methods described herein may provide a user with the ability to select the at least one of the one or more predetermined attenuated frequency ranges and/or the attenuated amplitude profiles to be applied and used to enhance intelligibility of speech. In one or more embodiments, selection from a variety of frequency ranges and/or amplitude profiles may be used to adjust the speech enhancement apparatus and methods for use with different respirator masks. For example, different respirator masks will often provide different attenuation characteristics and the speech enhancement apparatus and methods described herein may be selected to address those different attenuation characteristics when the speech enhancement apparatus and methods are used with different masks. One example of respirator masks that may provide different attenuation characteristics may, for example, be full facepiece respirator masks as opposed to partial facepiece respirator masks. Another example of respirator masks that may provide different attenuation characteristics may include two different partial facepiece respirator masks that have different constructions which attenuate speech differently.

Selection from a variety of frequency ranges and/or amplitude profiles in the speech enhancement apparatus and methods described herein may also be useful to adjust for speech differences between genders. For example, use of the speech enhancement apparatus and methods described herein to improve speech intelligibility may be best accomplished using different attenuated frequency ranges and/or attenuated amplitude profiles depending on the gender of the person wearing the respirator mask.

Selection from a variety of frequency ranges and/or amplitude profiles in the speech enhancement apparatus and methods described herein may also be useful to improve the intelligibility of speech in a noisy environment. For example, speech intelligibility in a noisy environment may be best enhanced by delivering compensating acoustic energy over frequency ranges and/or with amplitude profiles that may consume energy at a faster rate, while also providing a user with the opportunity to select attenuated frequency ranges and/or attenuated amplitude profiles that consume energy at a slower rate but which still enhance intelligibility of speech (in, for example, a quieter environment in which less aggressive compensating acoustic energy is required to improve the intelligibility of speech).

Referring to FIGS. 1 and 3, the selector switch 38 provided in connection with the illustrative embodiment of speech enhancement apparatus 20 may provide both on/off functionality, as well as provide a mechanism by which a user can select at least one of the one or more predetermined attenuated frequency ranges and/or attenuated amplitude profiles to be used to enhance speech intelligibility. In one or more alternative embodiments, one or more other switches or other selector devices may be used to provide the user with the ability to select at least one of the one or more predetermined attenuated frequency ranges and/or attenuated amplitude profiles to be used to enhance speech intelligibility.

Illustrative embodiments of the speech enhancement apparatus and methods and respirators used with the same as described herein are discussed and reference has been made to some possible variations. These and other variations and modifications in the invention will be apparent to those skilled in the art without departing from the scope of the invention, and it should be understood that this invention is not limited to the illustrative embodiments set forth herein. Accordingly, this invention is not limited to the above-described embodiments, but is to be controlled by the limitations set forth in the following claims and any equivalents thereof. This invention also may be suitably practiced in the absence of any element not specifically disclosed herein.

All patents and patent applications cited herein are incorporated by reference into this document in total. To the extent there is a conflict or discrepancy between this document and the disclosure in any such incorporated document, this document will control.

What is claimed is:

1. A respirator mask comprising:
    a mask body configured to define a clean air envelope between the mask and the mouth and nose of wearer and exhibiting an acoustic attenuation profile over a first frequency range; and
    a speech enhancement apparatus comprising:
    a microphone configured for attachment to the mask body, the microphone further configured to detect acoustic energy within the clean air envelope when attached to the mask body;
    a speaker configured to produce acoustic energy outside of the clean air envelope;
    a controller operably connected to the speaker and the microphone, wherein the controller is configured to:
    receive a speech signal from the microphone, wherein the speech signal is indicative of acoustic energy detected by the microphone within the first frequency range; and
    deliver an output signal to the speaker, wherein the output signal is configured to cause the speaker to emit compensating acoustic energy, wherein the compensating acoustic energy is emitted in one or more predetermined attenuated frequency ranges, and wherein the compensating acoustic energy comprises a predetermined attenuated amplitude profile such that the compensating acoustic energy exhibits an amplitude less than 6 dB greater than the acoustic attenuation profile of the mask body over at least 90% of each predetermined attenuated frequency range of the one or more predetermined attenuated frequency ranges.

2. A respirator mask according to claim 1, wherein the predetermined attenuated amplitude profile is uniform over at least one predetermined attenuated frequency range of the one or more predetermined attenuated frequency ranges.

3. A respirator mask according to claim 1, wherein the predetermined attenuated amplitude profile is non-uniform over at least one predetermined attenuated frequency range of the one or more predetermined attenuated frequency ranges.

4. A respirator mask according to claim 1, wherein the speech enhancement apparatus comprises a selector, the selector being operably connected to the controller and configured to select the one or more predetermined attenuated frequency ranges from two or more different predetermined attenuated frequency ranges.

5. A respirator mask according to claim 1, wherein the speech enhancement apparatus comprises a selector, the selector being operably connected to the controller and configured to select the one or more predetermined attenuated amplitude profiles from two or more different predetermined attenuated amplitude profiles.

6. A respirator mask according to claim 1, wherein the microphone, the speaker and the controller are located in a housing along with a power source that is operably connected to the controller, and wherein the housing is configured for attachment to the mask body.

7. A respirator mask according to claim 6, wherein the respirator mask comprises a port, and wherein the housing of the speech enhancement apparatus comprises a fitting configured for selective attachment to the port.

8. A respirator mask according to claim 1, wherein the microphone is attached to a housing that is configured for attachment to the mask body; and wherein the speaker and the controller are located in an auxiliary housing.

9. A respirator mask according to claim 1, wherein the one or more predetermined attenuated frequency ranges comprise only one predetermined attenuated frequency range.

10. A respirator mask according to claim 1, wherein the one or more predetermined attenuated frequency ranges comprise an upper limit of about 10,000 Hz or less.

11. A respirator mask according to claim 1, wherein the one or more predetermined attenuated frequency ranges comprise a lower limit of about 300 Hz or more.

12. A respirator mask according to claim 1, wherein the compensating acoustic energy exhibits an amplitude less than 3 dB greater than the acoustic attenuation profile of the mask body over at least 90% of each predetermined attenuated frequency range of the one or more predetermined attenuated frequency ranges.

13. A respirator mask according to claim 1, wherein the compensating acoustic energy exhibits an amplitude less than 6 dB greater than the acoustic attenuation profile of the mask body over at least 95% of each predetermined attenuated frequency range of the one or more predetermined attenuated frequency ranges.

14. A respirator mask according to claim 1, wherein the compensating acoustic energy exhibits an amplitude less than 3 dB greater than the acoustic attenuation profile of the mask body over at least 95% of each predetermined attenuated frequency range of the one or more predetermined attenuated frequency ranges.

15. A method of enhancing speech for the wearer of a respirator mask, the method comprising:
    detecting acoustic energy in a clean air envelope of a respirator mask using a microphone;
    delivering a speech signal to a controller from the microphone, wherein the speech signal is indicative of the detected acoustic energy within the first frequency range; and
    delivering an output signal to a speaker, wherein the output signal causes the speaker to emit compensating acoustic energy outside of the clean air envelope in one or more predetermined attenuated frequency ranges, and wherein the compensating acoustic energy comprises a predetermined attenuated amplitude profile such that the compensating acoustic energy exhibits an amplitude less than 6 dB greater than an acoustic attenuation profile of the mask body over at least 90% of each predetermined attenuated frequency range of the one or more predetermined attenuated frequency ranges.

16. A method according to claim 15, wherein the predetermined attenuated amplitude profile is uniform over at least one predetermined attenuated frequency range of the one or more predetermined attenuated frequency ranges.

17. A method according to claim 15, wherein the predetermined attenuated amplitude profile is non-uniform over at least one predetermined attenuated frequency range of the one or more predetermined attenuated frequency ranges.

18. A method according to claim 15, wherein the method further comprises selecting the one or more predetermined attenuated frequency ranges from two or more different predetermined attenuated frequency ranges.

19. A method according to claim 15, wherein the method further comprises selecting the one or more predetermined attenuated amplitude profiles from two or more different predetermined attenuated amplitude profiles.

20. A method according to claim 15, wherein the microphone is attached to a housing, and wherein the method further comprises attaching the housing to a port on the respirator mask.

21. A method according to claim 15, wherein the one or more predetermined attenuated frequency ranges comprise only one predetermined attenuated frequency range.

22. A method according to claim 15, wherein the one or more predetermined attenuated frequency ranges comprise an upper limit of about 10,000 Hz or less.

23. A method according to claim 15, wherein the one or more predetermined attenuated frequency ranges comprise a lower limit of about 300 Hz or more.

* * * * *